United States Patent
Tanaka

(10) Patent No.: US 9,644,624 B2
(45) Date of Patent: May 9, 2017

(54) PIEZOELECTRIC ACTUATOR

(71) Applicant: MURATA MANUFACTURING CO., LTD., Nagaokakyo-Shi, Kyoto-fu (JP)

(72) Inventor: Nobuhira Tanaka, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 434 days.

(21) Appl. No.: 14/184,238

(22) Filed: Feb. 19, 2014

(65) Prior Publication Data

US 2014/0169996 A1    Jun. 19, 2014

Related U.S. Application Data

(63) Continuation of application No. PCT/JP2012/070164, filed on Aug. 8, 2012.

(30) Foreign Application Priority Data

Sep. 6, 2011    (JP) .................................. 2011-194431

(51) Int. Cl.
*F04B 43/04*    (2006.01)
*F04D 33/00*    (2006.01)
*H01L 41/09*    (2006.01)

(52) U.S. Cl.
CPC ........... *F04B 43/046* (2013.01); *F04D 33/00* (2013.01); *H01L 41/094* (2013.01)

(58) Field of Classification Search
CPC . H04R 17/00; H01L 41/0926; H01L 41/0933; F04B 17/003; F04B 43/046; F04B 43/095
See application file for complete search history.

(56) References Cited

U.S. PATENT DOCUMENTS

2010/0047092 A1*    2/2010    Erturk ..................... F04D 33/00
                                                                417/410.2
2011/0002485 A1    1/2011    Onishi et al.
2011/0014069 A1*    1/2011    Wada ..................... F04D 33/00
                                                                417/410.2

FOREIGN PATENT DOCUMENTS

JP    2002-319717 A    10/2002
JP    2006-340503 A    12/2006
(Continued)

OTHER PUBLICATIONS

Written Opinion and International Search Report issued in PCT/JP2012/070164 mailed on Nov. 13, 2012.

*Primary Examiner* — Patrick Hamo
(74) *Attorney, Agent, or Firm* — Arent Fox LLP

(57) ABSTRACT

A piezoelectric fan includes a vibration sheet, piezoelectric elements, a reinforcing sheet having one principal surface bonded to the vibration sheet and the other principal surface bonded to the piezoelectric element, and a fixing sheet. The vibration sheet is fixed to the inside of an electronic device by the fixing sheet which is disposed at one end of the vibration sheet. The total thickness of the reinforcing sheet and a region of the vibration sheet in which the piezoelectric elements are disposed is greater than the average thickness of a region of the vibration sheet in which the piezoelectric elements are not disposed. The coefficient of linear expansion of the vibration sheet is higher than that of the first and second piezoelectric elements. The reinforcing sheet is formed of a material having a coefficient of linear expansion and a modulus of elasticity identical to the vibration sheet.

21 Claims, 7 Drawing Sheets

(56) References Cited

FOREIGN PATENT DOCUMENTS

| JP | 2008-172105 A | 7/2008 |
|---|---|---|
| WO | WO-2009-110575 A1 | 9/2009 |

\* cited by examiner

PRIOR ART

PIEZOELECTRIC ACTUATOR

CROSS REFERENCE TO RELATED APPLICATIONS

The present application is a continuation of PCT/JP2012/070164 filed Aug. 8, 2012, which claims priority to Japanese Patent Application No. 2011-194431, filed Sep. 6, 2011, the entire contents of each of which are incorporated herein by reference.

FIELD OF THE INVENTION

The present invention relates to a piezoelectric actuator in which piezoelectric ceramics extend and contract by the application of a voltage.

BACKGROUND OF THE INVENTION

Currently, for the purpose of cooling electronic devices which contain heating components, such as CPUs and LSIs, piezoelectric actuators which utilize piezoelectric ceramics having the property of extending and contracting by the application of a voltage are extensively used. For example, Patent Document 1 discloses a piezoelectric fan 9 having a sectional configuration shown in FIG. 1.

FIG. 1 is a sectional view illustrating the configuration of the piezoelectric fan 9 disclosed in Patent Document 1. The piezoelectric fan 9 includes a vibration sheet 1, piezoelectric elements 2, a support member 3, and a drive circuit 20.

As shown in FIG. 1, one piezoelectric element 2 is attached to one principal surface of the vibration sheet 1 and the other piezoelectric element 2 is attached to the other principal surface of the vibration sheet 1 with bonding layers 5 therebetween. The support member 3 is attached to one side of the vibration sheet 1 and fixes the vibration sheet 1 at one end in a cantilever structure. The end of the vibration sheet 1 fixed by the support member 3 is a fixed end, and the other end of the vibration sheet 1 is a free end.

The piezoelectric elements 2 and the vibration sheet 1 form a bimorph vibrator in which the two piezoelectric elements 2 sandwich the vibration sheet 1, which serves as an intermediate electrode, from both the principal surfaces. The structure of each of the two piezoelectric elements 2 is such that electrodes 4 are formed on the front and back sides of piezoelectric ceramics 8. The drive circuit 20 which outputs an AC voltage is connected to each of the electrodes 4 and the vibration sheet 1. The piezoelectric elements 2 have been subjected to poling treatment so that, when an AC voltage is applied between each of the electrodes 4 and the vibration sheet 1, the vibration sheet 1 may bend in its thickness direction so as to perform bending vibration.

With the above-described configuration, by the application of an AC voltage between each of the electrode films 4 and the vibration sheet 1 from the drive circuit 20, when one of the piezoelectric elements 2 extends, the other piezoelectric element 2 contracts, and conversely, when one of the piezoelectric elements 2 contracts, the other piezoelectric element 2 extends. In accordance with this extending and contracting operation of the piezoelectric elements 2, the vibration sheet 1 performs bending vibration.

Accordingly, by installing the piezoelectric fan 9 near a heating component, such as an LSI or a CPU, within an electronic device, when an AC voltage is applied to the piezoelectric fan 9, the free end of the vibration sheet 1 swings like a fan. In this manner, cooling air is generated so as to cool the heating component.

Patent Document 1: Japanese Unexamined Patent Application Publication No. 2008-172105

However, in the piezoelectric fan 9, due to the bending vibration of the vibration sheet 1, tensile stress is applied to the piezoelectric elements 2, which is in contact with the vibration sheet 1. Although the piezoelectric ceramics 8 of the piezoelectric elements 2 are resistant to compressive stress, they are vulnerable to tensile stress. Accordingly, while the vibration sheet 1 is performing bending vibration, a load is imposed on the piezoelectric ceramics 8 due to the tensile stress applied to the piezoelectric elements 2.

Thus, if the bending vibration of the vibration sheet 1 is performed for a long time and the load accumulates within the piezoelectric ceramics 8, the piezoelectric ceramics 8 crack and are broken.

SUMMARY OF THE INVENTION

Accordingly, it is an object of the present invention to provide a piezoelectric actuator in which it is possible to suppress breakage of piezoelectric elements caused by tensile stress which is applied during bending vibration of a vibration sheet.

In order to solve the above-described problem, a piezoelectric actuator of the present invention has the following configuration.

(1) The piezoelectric actuator includes: a first piezoelectric element that extends and contracts in accordance with an application of an alternating current voltage; a second piezoelectric element that extends and contracts in a phase opposite to a phase of the first piezoelectric element in accordance with the application of the alternating current voltage; a vibration sheet that bends in accordance with extending and contracting of the first and second piezoelectric elements, both of principal surfaces of the vibration sheet being sandwiched between the first and second piezoelectric elements; a reinforcing member having one principal surface which is bonded to the vibration sheet and the other principal surface which is bonded to the first piezoelectric element; and a fixing member that fixes the vibration sheet. A total thickness of the reinforcing member and a region of the vibration sheet in which the first and second piezoelectric elements are disposed is greater than an average thickness of a region of the vibration sheet in which the first and second piezoelectric elements are not disposed.

In this configuration, the thickness is partially increased by the provision of the reinforcing member. Accordingly, it is possible to increase the stiffness ratio of a region defined by the width of the vibration sheet and the distance in the longitudinal direction of the vibration sheet extending from ends of the first and second piezoelectric elements adjacent to an end portion of the vibration sheet opposite to the fixing member (such an end portion will be referred to as a "free end" among end portions extending in parallel with the widthwise direction of the vibration sheet) to an end portion of the fixing member adjacent to the free end of the vibration sheet (such an end portion will be referred to as a "fixed end" among the end portions extending in parallel with the widthwise direction of the vibration sheet) to a region defined by the width of the vibration sheet and the distance in the longitudinal direction of the vibration sheet extending from the free end of the vibration sheet to the ends of the first and second piezoelectric elements adjacent to the free end of the vibration sheet. Thus, the amount by which the first and second piezoelectric elements are deformed necessary to obtain the same amplitude of the free end of the vibration sheet is decreased. As a result, it is possible to reduce tensile stress applied to the first and second piezoelectric elements.

Accordingly, in this configuration, by reducing tensile stress applied to the first and second piezoelectric elements by using the reinforcing member, it is possible to easily make the residual compressive stress applied to the first and second piezoelectric elements be greater than the highest tensile stress applied to the first and second piezoelectric elements during bending vibration of the vibration sheet. That is, during bending vibration of the vibration sheet, compressive stress is constantly applied to the first and second piezoelectric elements.

As is seen from the foregoing description, in this configuration, even if tensile stress is applied to the first and second piezoelectric elements during bending vibration of the vibration sheet, it is possible to suppress breakage of the first and second piezoelectric elements.

(2) A coefficient of linear expansion of the vibration sheet may preferably be higher than a coefficient of linear expansion of the first and second piezoelectric elements, and the reinforcing member may preferably be formed of a material having a coefficient of linear expansion and a modulus of elasticity which are identical to a coefficient of linear expansion and a modulus of elasticity, respectively, of a material for the vibration sheet.

In this configuration, the identical coefficient of linear expansion includes a case in which the coefficient of linear expansion of the reinforcing member is substantially equal to that of the vibration sheet. The identical modulus of elasticity includes a case in which the modulus of elasticity of the reinforcing member is substantially equal to that of the vibration sheet.

In this configuration, the coefficient of linear expansion of the vibration sheet is higher than that of the first and second piezoelectric elements. Accordingly, when the temperature returns to the room temperature after bonding the vibration sheet and the first and second piezoelectric elements to each other with, for example, a thermosetting resin, residual compressive stress is applied to the first and second piezoelectric elements. Moreover, in this configuration, the total thickness of the reinforcing member and a region of the vibration sheet in which the first and second piezoelectric elements are disposed is greater than the average thickness of a region of the vibration sheet in which the first and second piezoelectric elements are not disposed. Thus, it is possible to further increase the residual compressive stress applied to the first and second piezoelectric elements.

That is, in this configuration, an increase in the residual compressive stress applied to the first and second piezoelectric elements and a decrease in the tensile stress applied to the first and second piezoelectric elements can be implemented at the same time.

Accordingly, in this configuration, by adjusting an increase in the residual compressive stress and a decrease in the tensile stress by using the reinforcing member, it is possible to easily make the residual compressive stress applied to the first and second piezoelectric elements be greater than the highest tensile stress applied to the first and second piezoelectric elements during bending vibration of the vibration sheet. That is, during bending vibration of the vibration sheet, compressive stress is constantly applied to the first and second piezoelectric elements.

As is seen from the foregoing description, in this configuration, even if tensile stress is applied to the first and second piezoelectric elements during bending vibration of the vibration sheet, it is possible to suppress breakage of the first and second piezoelectric elements.

(3) It is preferable that, among end portions of the reinforcing member and the first piezoelectric element extending in parallel with a widthwise direction of the vibration sheet, end portions of the reinforcing member and the first piezoelectric element opposite to end portions adjacent to the fixing member may be bonded so as to be flush with each other.

In this configuration, the average thickness of the region of the vibration sheet in which the first piezoelectric element is not disposed is further decreased. Accordingly, it is possible to further increase the stiffness ratio of a region defined by the width of the vibration sheet and the distance in the longitudinal direction of the vibration sheet extending from ends of the first and second piezoelectric elements adjacent to an end portion of the vibration sheet opposite to the fixing member (such an end portion will be referred to as a "free end" among the end portions extending in parallel with the widthwise direction of the vibration sheet) to the fixed end among the end portions extending in parallel with the widthwise direction of the vibration sheet to a region defined by the width of the vibration sheet and the distance in the longitudinal direction of the vibration sheet extending from the free end of the vibration sheet to the ends of the first and second piezoelectric elements adjacent to the free end of the vibration sheet.

Thus, the amount by which the first and second piezoelectric elements are deformed necessary to obtain the same amplitude of the free end of the vibration sheet is decreased. As a result, it is possible to further reduce tensile stress applied to the first and second piezoelectric elements caused by bending vibration of the vibration sheet, thereby making it possible to further suppress breakage of the first and second piezoelectric elements.

(4) A thickness of the first piezoelectric element may preferably be identical to a thickness of the second piezoelectric element, and the first piezoelectric element may preferably be formed of a material having a coefficient of linear expansion and a modulus of elasticity which are identical to a coefficient of linear expansion and a modulus of elasticity, respectively, of a material for the second piezoelectric element.

In this configuration, when the temperature returns to the room temperature after performing a bonding operation of the piezoelectric actuator with, for example, a thermosetting resin, it is even less likely that warpage will occur in the piezoelectric actuator. Accordingly, residual compressive stress can be more effectively applied to the first and second piezoelectric elements, thereby making it possible to further suppress breakage of the first and second piezoelectric elements.

(5) A material for the reinforcing member may preferably be identical to a material for the vibration sheet.

With this configuration, bonding of the reinforcing member and the vibration sheet is facilitated.

(6) It is preferable that the first and second piezoelectric elements and the reinforcing member may be each disposed so as to have a symmetrical arrangement with respect to a center line of a lateral direction of the vibration sheet.

With this configuration, it is less likely that torsion will occur in the vibration sheet when the piezoelectric actuator is driven, thereby making it possible to further suppress breakage of the first and second piezoelectric elements.

(7) The vibration sheet and the reinforcing member may preferably be formed of a metallic material.

In this configuration, since a metallic material having a modulus of elasticity higher than other materials is used, a high level of residual compressive stress can be generated.

It is thus possible to further suppress breakage of the first and second piezoelectric elements.

According to the present invention, even if tensile stress is applied to piezoelectric elements during bending vibration of a vibration sheet, breakage of the piezoelectric elements can be suppressed.

DETAILED DESCRIPTION OF THE PREFERRED EMBODIMENTS

First Embodiment

A piezoelectric fan according to a first embodiment of the present invention will be described below with reference to FIGS. 2 and 3A.

Figure 1:
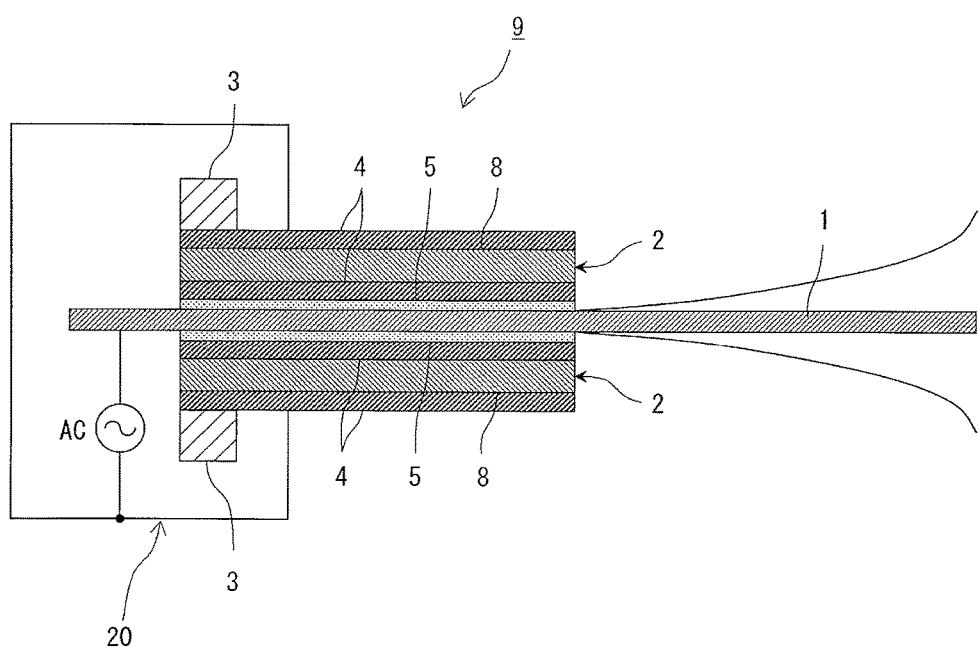
FIG. 1 is a sectional view illustrating the configuration of a piezoelectric fan 9 disclosed in Patent Document 1.
Figure 2:
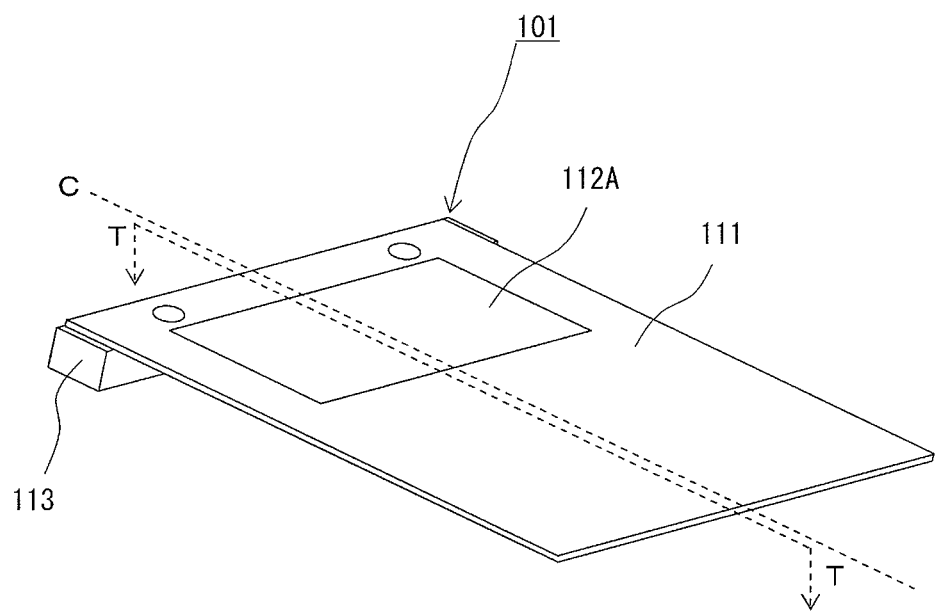
FIG. 2 is a perspective view illustrating the configuration of a piezoelectric fan 101 according to a first embodiment.

FIG. 2 is a perspective view illustrating the configuration of a piezoelectric fan 101 according to the first embodiment. FIG. 3A is a sectional view taken along with line T-T of FIG. 2.

Figure 3A:
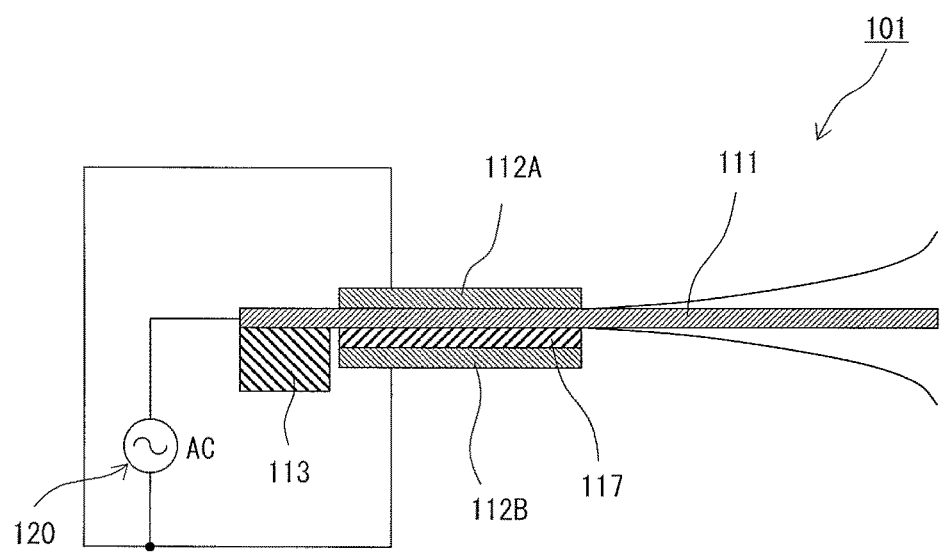
FIG. 3A is a sectional view illustrating the configuration of the piezoelectric fan 101 according to the first embodiment.

The piezoelectric fan 101 includes, as shown in FIG. 3A, a vibration sheet 111, piezoelectric elements 112A and 112B, a reinforcing sheet 117, a fixing sheet 113, and a drive AC power source 120. The piezoelectric fan 101 is installed within an electronic device having a built-in heating element, such as a CPU, and cools the inside of the electronic device.

The vibration sheet 111 is, for example, a stainless steel sheet and has 15 mm-wide×40 mm-long×0.1 mm-thick dimensions. The vibration sheet 111 is fixed at one end in a cantilever structure to the inside of the electronic device by using the fixing sheet 113 which is provided at this end of the vibration sheet 111. The end of the vibration sheet 111 fixed by the fixing sheet 113 is a fixed end, and the other end of the vibration sheet 111 is a free end. The piezoelectric element 112A is attached to one principal surface of the vibration sheet 111, while the reinforcing sheet 117 is attached to the other principal surface of the vibration sheet 111. The piezoelectric element 112B is attached to a principal surface of the reinforcing sheet 117 opposite to the principal surface of the reinforcing sheet 117 attached to the vibration sheet 111.

For the vibration sheet 111, instead of a stainless steel sheet, another sheet made of a metal having high spring characteristics, such as phosphor bronze, or a resin sheet may be used.

The reinforcing sheet 117 is, for example, a stainless steel sheet and has 15 mm-wide×15 mm-long×0.1 mm-thick dimensions. The length of the reinforcing sheet 117 in the longitudinal direction of the vibration sheet 111 is the same as that of the piezoelectric element 112B in the longitudinal direction of the vibration sheet 111. The piezoelectric element 112B is attached to the surface of the reinforcing sheet 117 opposite to the surface of the reinforcing sheet 117 attached to the vibration sheet 111. That is, the reinforcing sheet 117 is attached to a partial region of the vibration sheet 111 in which the piezoelectric elements 112A and 112B are disposed. The reinforcing sheet 117 is attached to the vibration sheet 111 such that it has a symmetrical arrangement with respect to a center line C of the lateral direction (widthwise direction) of the vibration sheet 111.

For the reinforcing sheet 117, a metallic sheet other than a stainless steel sheet or a resin sheet may be used as long as it is made of a material having the same coefficient of linear expansion and the same modulus of elasticity as those of the vibration sheet 111. In this embodiment, since the reinforcing member 117 and the vibration sheet 111 are made of the same material, it is easy to bond the reinforcing member 117 and the vibration sheet 111.

The vibration sheet 111 is made of a material having a coefficient of linear expansion higher than that of the piezoelectric elements 112A and 112B. In this embodiment, since the vibration sheet 111 and the reinforcing sheet 117 are made of the same material, the coefficient of linear expansion and the modulus of elasticity of the reinforcing sheet 117 are the same as those of the vibration sheet 111. The piezoelectric elements 112A and 112B, the reinforcing sheet 117, and the vibration sheet 111 are bonded to each other with an adhesive at a temperature (in this embodiment, 130° C.) higher than the temperature (for example, 50° C.) within the electronic device when it is powered ON. Accordingly, the vibration sheet 111 is in contact with the piezoelectric element 112A, while the reinforcing sheet 117 is in contact with the piezoelectric element 112B. Thus, after bonding these components to each other, at the temperature within the electronic device, residual compressive stress generated by the vibration sheet 111 and the reinforcing sheet 117 is applied to the piezoelectric elements 112A and 112B, respectively.

Figure 3B:
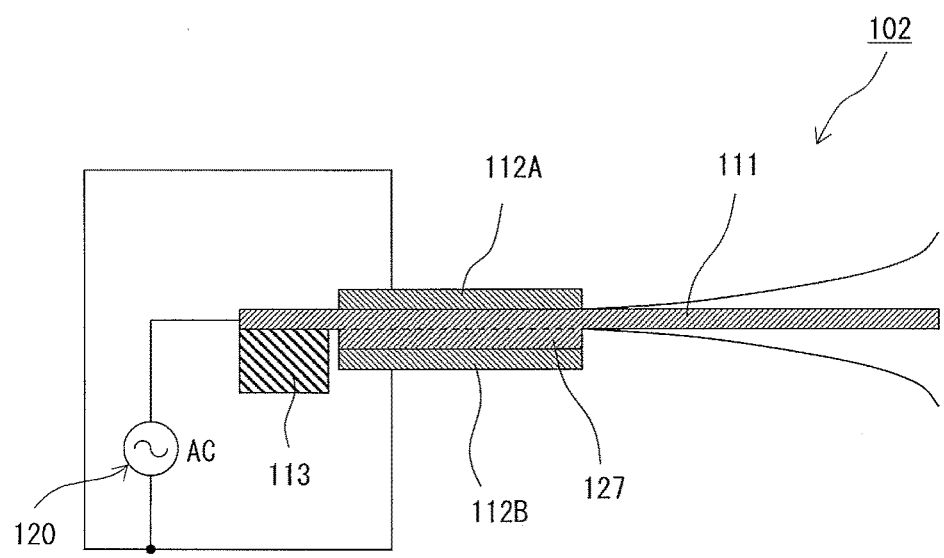
FIG. 3B is a sectional view illustrating the configuration of a piezoelectric fan 102 according to a modified example of the first embodiment.

The reinforcing sheet 117 corresponds to a "reinforcing member" of the present invention, the piezoelectric element 112B corresponds to a "first piezoelectric element" of the present invention, and the fixing sheet 113 corresponds to a "fixing member" of the present invention. In FIG. 3A, the reinforcing sheet 117 and the vibration sheet 111 are formed as separate components. When carrying out this embodiment, however, a reinforcing member 127 and the vibration sheet 111 may be integrally formed of the same material, as shown in FIG. 3B.

The piezoelectric elements 112A and 112B each have 15 mm-wide×15 mm-long×0.1 mm-thick dimensions and are made of, for example, PZT ceramics. The piezoelectric elements 112A and 112B are disposed such that they sandwich the same region of the vibration sheet 111, which serves as an intermediate electrode, from both the principal surfaces of the vibration sheet 111. Each of the piezoelectric elements 112A and 112B has a symmetrical arrangement with respect to a center line C of the lateral direction (widthwise direction) of the vibration sheet 111. The center line C is a straight line passing through the center of each of the two shorter sides of the vibration sheet 111. That is, the piezoelectric fan 101 forms a bimorph vibrator by using the piezoelectric elements 112A and 112B, the reinforcing sheet 117, and the vibration sheet 111. The structure of each of the two piezoelectric elements 112A and 112B is such that electrode films are formed on the front and back sides of piezoelectric ceramics. The drive AC power source 120 which outputs an AC voltage is connected to each of the electrode films and the vibration sheet 111. The piezoelectric elements 112A and 112B have been subjected to poling treatment so that, when an AC voltage is applied between each of the electrode films and the vibration sheet 111, the vibration sheet 111 may bend in its thickness direction so as to perform bending vibration. By forming the piezoelectric fan 101 as a bimorph vibrator, the displacement by which the vibration sheet 111 bends in accordance with the operation of the piezoelectric elements 112A and 112B in response to a voltage applied to the vibration sheet 111 can be increased, thereby making it possible to more effectively increase the amplitude of the free end of the vibration sheet 111. By forming the piezoelectric fan 101 as a bimorph vibrator, residual compressive stress generated by the reinforcing sheet 117 can be equally applied to the piezoelectric elements 112A and 112B.

The fixing sheet 113 is made of, for example, glass epoxy, and has 15 mm-wide×5 mm-long×2 mm-thick dimensions. There is a space of 1 mm between the fixing sheet 113 and each of the piezoelectric elements 112A and 112B.

By the application of an AC voltage from the drive AC power source 120 to the piezoelectric fan 101 configured as described above, when the piezoelectric element 112A extends, the piezoelectric element 112B contracts, and conversely, when the piezoelectric element 112A contracts, the piezoelectric element 112B extends. In accordance with this extending and contracting operation of the piezoelectric elements 112A and 112B, the vibration sheet 111 performs bending vibration.

Accordingly, by installing the piezoelectric fan 101 near a heating component, such as an LSI or a CPU, within an electronic device, when an AC voltage is applied to the piezoelectric fan 101, the free end of the vibration sheet 111 swings like a fan. In this manner, cooling air is generated so as to cool the heating component.

In this case, in the piezoelectric fan 101 of this embodiment, too, the vibration sheet 111 performs bending vibration. In the piezoelectric fan 101 of this embodiment, however, the coefficient of linear expansion of the vibration sheet 111 is higher than that of the piezoelectric elements 112A and 112B. Accordingly, when the temperature returns to the room temperature after bonding the vibration sheet 111 and the piezoelectric elements 112A and 112B to each other with a thermosetting resin, residual compressive stress is applied to the piezoelectric elements 112A and 112B.

Additionally, in the above-described configuration, the total thickness of the reinforcing sheet 117 and a region of the vibration sheet 111 in which the piezoelectric elements 112A and 112B are disposed is greater than the average thickness of a region of the vibration sheet 111 in which the piezoelectric elements 112A and 112B are not disposed. It is thus possible to further increase residual compressive stress applied to the piezoelectric elements 112A and 112B.

In the piezoelectric fan 101 of this embodiment, the thickness is partially increased by the provision of the reinforcing sheet 117. Accordingly, it is possible to increase the stiffness ratio of a region defined by the width of the vibration sheet 111 and the distance in the longitudinal direction of the vibration sheet 111 extending from ends of the piezoelectric elements 112A and 112B adjacent to the free end of the vibration sheet 111 to the fixed end of the vibration sheet 111 to a region defined by the width of the vibration sheet 111 and the distance in the longitudinal direction of the vibration sheet 111 extending from the free end of the vibration sheet 111 to the ends of the piezoelectric elements 112A and 112B adjacent to the free end of the vibration sheet 111. Thus, the amount by which the piezoelectric elements 112A and 112B are deformed necessary to obtain the same amplitude of the free end of the vibration sheet 111 is decreased, thereby making it possible to reduce tensile stress applied to the piezoelectric elements 112A and 112B.

That is, in the piezoelectric fan 101 of this embodiment, an increase in the residual compressive stress applied to the piezoelectric elements 112A and 112B and a decrease in the tensile stress applied to the piezoelectric elements 112A and 112B can be implemented at the same time.

Accordingly, in the piezoelectric fan 101 of this embodiment, by adjusting an increase in the residual compressive stress and a decrease in the tensile stress by using the reinforcing sheet 117, it is possible to easily make the residual compressive stress applied to the piezoelectric elements 112A and 112B be greater than the highest tensile stress applied to the piezoelectric elements 112A and 112B during bending vibration of the vibration sheet 111. That is, during bending vibration of the vibration sheet 111, compressive stress is constantly applied to the piezoelectric elements 112A and 112B.

As is seen from the foregoing description, in the piezoelectric fan 101 of this embodiment, it is possible to suppress breakage of piezoelectric elements 112A and 112B caused by the application of tensile stress during bending vibration of the vibration sheet 111.

In the piezoelectric fan 101 of this embodiment, among end portions of the reinforcing sheet 117 and the piezoelectric element 112B extending parallel with the widthwise direction of the vibration sheet 111, end portions of the reinforcing sheet 117 and the piezoelectric element 112B adjacent to the free end of the vibration sheet 111 are bonded to each other such that the end faces are flush with each other. With this configuration, the average thickness of the region of the vibration sheet 111 in which the piezoelectric elements 112A and 112B are not disposed is made even smaller. It is therefore possible to further increase the stiffness ratio of the region defined by the width of the vibration sheet 111 and the distance in the longitudinal direction of the vibration sheet 111 extending from the ends of the piezoelectric elements 112A and 112B adjacent to the free end of the vibration sheet 111 to the fixed end of the vibration sheet 111 to the region defined by the width of the vibration sheet 111 and the distance in the longitudinal direction of the vibration sheet 111 extending from the free end of the vibration sheet 111 to the ends of the piezoelectric elements 112A and 112B adjacent to the free end of the vibration sheet 111. Thus, the amount by which the piezoelectric elements 112A and 112B are deformed necessary to obtain the same amplitude of the free end of the vibration sheet 111 is further decreased. As a result, it is possible to further reduce tensile stress applied to the piezoelectric elements 112A and 112B.

In this embodiment, the end portion of the reinforcing sheet 117 and the end portion of the piezoelectric element 112B adjacent to the free end of the vibration sheet 111 are bonded to each other such that the end faces are flush with each other. However, this configuration is only an example. For example, the reinforcing sheet 117 and the piezoelectric element 112B may be bonded to each other such that the end portion of the reinforcing sheet 117 adjacent to the free end of the vibration sheet 111 protrudes farther toward the free end of the vibration sheet 111 than the end portion of the piezoelectric element 112B adjacent to the free end of the vibration sheet 111.

In this embodiment, the piezoelectric element 112B has the same thickness as that of the piezoelectric element 112A, and is made of a material having the same coefficient of linear expansion and the same modulus of elasticity as those of a material for the piezoelectric element 112A. With this configuration, when the temperature returns to the room temperature after performing a bonding operation of the piezoelectric fan 101 with, for example, a thermosetting resin, it is even less likely that warpage will occur in the piezoelectric fan 101. Accordingly, residual compressive stress can be more efficiently applied to the piezoelectric elements 112A and 112B, thereby making it possible to further suppress breakage of the piezoelectric elements 112A and 112B.

In this embodiment, the piezoelectric elements 112A and 112B and the reinforcing sheet 117 are each disposed such that it has a symmetrical arrangement with respect to the center line C of the lateral direction of the vibration sheet 111 (see FIG. 2). With this arrangement, it is less likely that torsion will occur in the vibration sheet 111 when the piezoelectric fan 101 is driven, thereby making it possible to further suppress breakage of the piezoelectric elements 112A and 112B.

In this embodiment, since the vibration sheet 111 and the reinforcing sheet 117 are made of a metallic material having a modulus of elasticity higher than other materials, a high level of residual compressive stress can be generated. It is thus possible to further suppress breakage of the piezoelectric elements 112A and 112B.

Air blowing performance and stress of the piezoelectric fan 101 will now be compared with those of piezoelectric fans 10, 10', and 101' of comparative examples. The results obtained by calculating the air blowing performance and stress of the piezoelectric fan 101 of this embodiment and those of the piezoelectric fans 10, 10', and 101' of the comparative examples by using FEM (Finite Element Method) are shown in Table 1.

Figure 4:
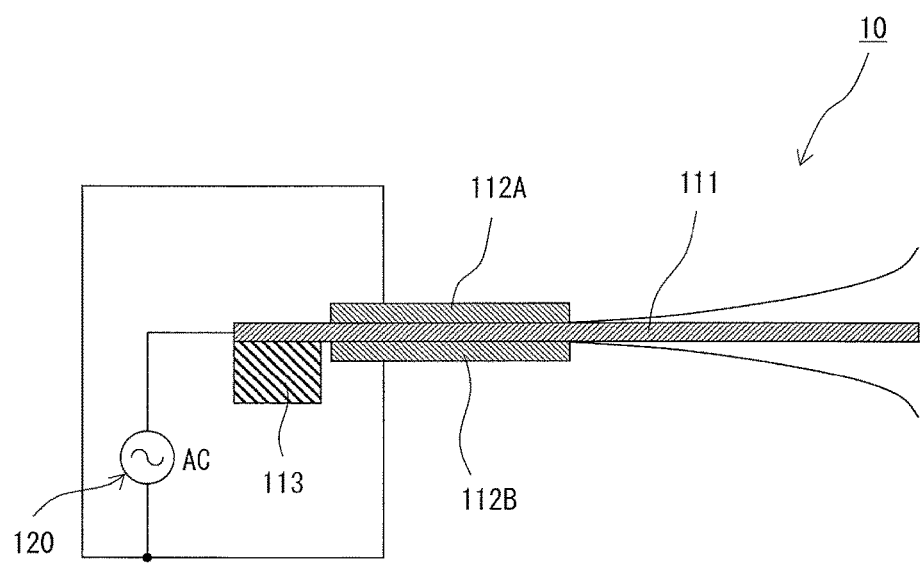
FIG. 4 is a sectional view illustrating the configuration of a piezoelectric fan 10 according to a comparative example.

FIG. 4 is a sectional view illustrating the configuration of the piezoelectric fan 10. The same piezoelectric fan 10 shown in Table 1 is different from the piezoelectric fan 101 of this embodiment in that the reinforcing sheet 117 is not disposed, and the configuration of the other elements is the same as the piezoelectric fan 101. The piezoelectric fan 10' shown in Table 1 is different from the piezoelectric fan 10 in that the thickness of the entire vibration sheet 111 is 0.2 mm, and the configuration of the other elements is the same as the piezoelectric fan 10. The piezoelectric fan 101' shown in Table 1 is different from the piezoelectric fan 101 in that the reinforcing sheet 117 of the piezoelectric fan 101' is made of a material (stainless steel 430) having a coefficient of linear expansion different from that of the material (stainless steel 304) for the vibration sheet 111, and the configuration of the other elements is the same as the piezoelectric fan 101.

In this embodiment, the coefficient of linear expansion of each of the piezoelectric elements 112A and 112B is 8.3 ppm/K, and the coefficient of linear expansion of the stainless steel 304 is 17.3 ppm/K. The coefficient of linear expansion of stainless steel 430 is 10.4 ppm/K.

Table 1 shows the results of calculating the amplitude of the free end of the vibration sheet 111 of each of the piezoelectric fans and the stress applied to each of the piezoelectric elements 112A and 112B under the conditions that a sine wave AC voltage of 24 Vpp at a resonant frequency was applied to each of the piezoelectric fans under a predetermined temperature (50° C.) for a certain period of time so as to cause the piezoelectric fans to perform resonance vibration at a semi-amplitude. The total stress shown in Table 1 indicates the difference between the highest tensile stress applied to each of the piezoelectric elements 112A and 112B and the residual compressive stress applied to each of the piezoelectric elements 112A and 112B during bending vibration of the vibration sheet 111.

The calculation results illustrated in Table 1 show that the highest tensile stress of the piezoelectric fan 10 and that of the piezoelectric fan 10' of the comparative examples are 67.6 MPa and 98.4 MPa, respectively, and, in contrast, the highest tensile stress of the piezoelectric fan 101 of this embodiment and that of the piezoelectric fan 101' of the comparative example are reduced to 40.5 MPa. The reason why these results were obtained may be as follows. By disposing the reinforcing sheet 117 in a partial region of the vibration sheet 111 in which the piezoelectric elements 112A and 112B are disposed, the stiffness ratio of the region defined by the width of the vibration sheet 111 and the

TABLE 1

|  | Piezoelectric fan 101 | Piezoelectric fan 10 | Piezoelectric fan 10' | Piezoelectric fan 101' |
| --- | --- | --- | --- | --- |
| Vibration sheet | SUS304 0.1 mm thickness | SUS304 0.1 mm thickness | SUS304 0.2 mm thickness | SUS304 0.1 mm thickness |
| Reinforcing sheet | SUS304 0.1 mm thickness | None | None | SUS430 0.1 mm thickness |
| Resonant frequency | 197 Hz | 123 Hz | 196 Hz | 197 Hz |
| Amplitude of free end | 4.0 mm | 6.3 mm | 4.0 mm | 4.0 mm |
| Highest tensile stress caused by bending vibration | 40.5 MPa | 67.6 MPa | 98.4 MPa | 40.5 MPa |
| Residual compressive stress | 54.6 MPa | 43.2 MPa | 54.6 MPa | 11.3 MPa |
| Total stress | 13.1 MPa compressive stress | 14.4 MPa tensile stress | 43.8 MPa tensile stress | 29.2 MPa tensile stress | distance in the longitudinal direction of the vibration sheet 111 extending from the ends of the piezoelectric elements 112A and 112B adjacent to the free end of the vibration sheet 111 to the fixed end of the vibration sheet 111 to the region defined by the width of the vibration sheet 111 and the distance in the longitudinal direction of the vibration sheet 111 extending from the free end of the vibration sheet 111 to the ends of the piezoelectric elements 112A and 112B adjacent to the free end of the vibration sheet 111 was increased. Thus, the amount by which the piezoelectric elements 112A and 112B were deformed by bending vibration of the vibration sheet 111 was decreased.

The calculation results illustrated in Table 1 also show that the residual compressive stress of the piezoelectric fan 10 of the comparative example is 43.2 MPa, and, in contrast, the total stress of the piezoelectric fan 101 of this embodiment and that of the piezoelectric fan 10' of the comparative example are increased to 54.6 MPa. The reason why these results were obtained may be as follows. By disposing the reinforcing sheet 117, the total thickness of the reinforcing sheet 117 and the region of the vibration sheet 111 in which the piezoelectric elements 112A and 112B were disposed was increased, and thus, the residual compressive stress applied to the piezoelectric elements 112A and 112B was increased.

In the piezoelectric fan 101' of the comparative example, although, as in the piezoelectric fan 101 of this embodiment, the total thickness of the reinforcing sheet 117 and the region of the vibration sheet 111 in which the piezoelectric elements 112A and 112B are disposed is greater, the residual compressive stress is as small as 11.3 MPa. The reason for this may be as follows. Since the coefficient of linear expansion of the vibration sheet 111 was different from that of the reinforcing sheet 117, warpage occurred in the piezoelectric fan 101'. As a result, the residual compressive stress was not efficiently applied to the piezoelectric elements 112A and 112B.

The calculation results illustrated in Table 1 also show that the total stress of the piezoelectric fan 10, that of the piezoelectric fan 10', and that of the piezoelectric fan 101' of the comparative examples are 14.4 MPa, 43.8 MPa, and 29.2 MPa, respectively, of tensile stress and, in contrast, the total stress of the piezoelectric fan 101 of this embodiment is increased to 13.1 MPa of compressive stress. It has therefore been proved that only in the piezoelectric fan 101 of this embodiment, compressive stress is constantly applied to the piezoelectric elements 112A and 112B during bending vibration of the vibration sheet 111.

Experiments show that, after the lapse of a certain time (in this embodiment, 100 hours), at least one of the piezoelectric elements 112A and 112B of the piezoelectric fans 10, 10', and 101' of the comparative examples cracked, and, in contrast, neither of the piezoelectric elements 112A and 112B of the piezoelectric fan 101 of this embodiment cracked.

In the piezoelectric fan 101 of this embodiment, an increase in the residual compressive stress applied to the piezoelectric elements 112A and 112B and a decrease in the tensile stress applied to piezoelectric elements 112A and 112B can be implemented at the same time, and thus, compressive stress is constantly applied to the piezoelectric elements 112A and 112B during bending vibration of the vibration sheet 111. Therefore, the piezoelectric fan 101 of this embodiment seems to be most suitable.

The calculation results illustrated in Table 1 also show that, in the piezoelectric fan 101 of this embodiment, the air blowing performance (the amplitude of the free end×resonant frequency) is not decreased even by the provision of the reinforcing sheet 117. It has therefore been proved that, in the piezoelectric fan 101 of this embodiment, an increase in the residual compressive stress applied to the piezoelectric elements 112A and 112B and a decrease in the tensile stress applied to piezoelectric elements 112A and 112B can be implemented at the same time without impairing the air blowing performance. The reason for this may be as follows. Since the reinforcing sheet 117 was disposed only in a region of the vibration sheet 111 in which the piezoelectric elements 112A and 112B were disposed, the stiffness of a region of the vibration sheet 111 from the piezoelectric elements 112A and 112B toward the free end of the vibration sheet 111, which affects the amplitude of the free end, was not increased.

Accordingly, by using the piezoelectric fan 101 of this embodiment, it is possible to suppress breakage of the piezoelectric elements 112A and 112B caused by the application of tensile stress during bending vibration of the vibration sheet 111, without impairing the air blowing performance.

Second Embodiment

A piezoelectric fan according to a second embodiment of the present invention will be described below.

Figure 5A:
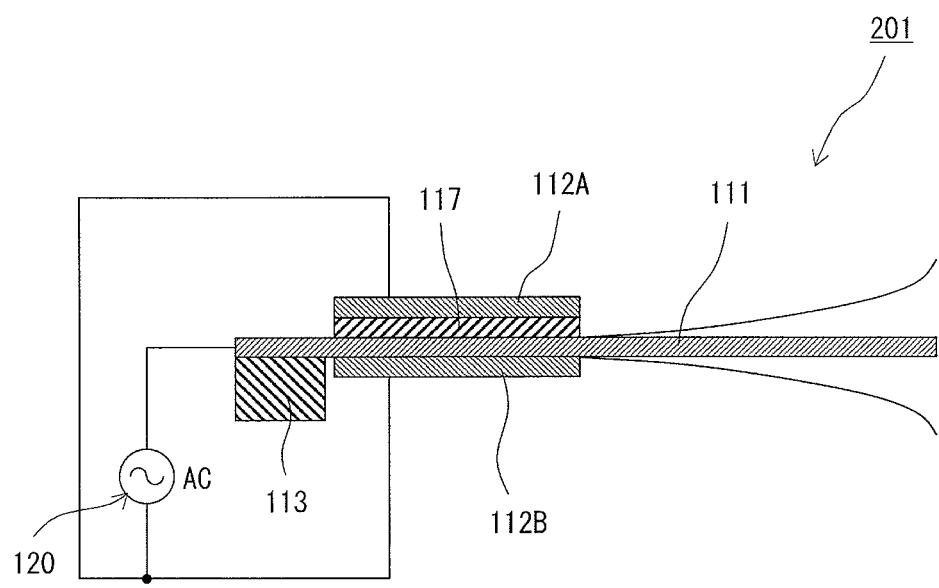
FIG. 5A is a sectional view illustrating the configuration of a piezoelectric fan 201 according to a second embodiment.

FIG. 5A is a sectional view illustrating the configuration of a piezoelectric fan 201 according to the second embodiment. The piezoelectric fan 201 of the second embodiment is different from the piezoelectric fan 101 of the first embodiment in that the reinforcing sheet 117 is disposed on the principal surface of the vibration sheet 111 adjacent to the piezoelectric element 112A. The configuration of the other elements is the same as that of the piezoelectric fan 101. In this embodiment, the piezoelectric element 112A corresponds to a "first piezoelectric element" of the present invention.

Details of the piezoelectric fan 201 of this embodiment will be discussed. In the piezoelectric fan 201, the reinforcing sheet 117 is bonded to the vibration sheet 111 such that it sandwiches, together with the piezoelectric element 112B, both of the principal surfaces of the vibration sheet 111. The piezoelectric element 112A is attached to the surface of the reinforcing sheet 117 opposite to the surface of the reinforcing sheet 117 bonded to the vibration sheet 111. That is, the reinforcing sheet 117 is bonded to a region of the vibration sheet 111 in which the piezoelectric elements 112A and 112B are disposed.

Accordingly, in the piezoelectric fan 201 of this embodiment, as well as in the piezoelectric fan 101, the total thickness of the reinforcing sheet 117 and the region of the vibration sheet 111 in which the piezoelectric elements 112A and 112B are disposed is greater than the average thickness of a region of the vibration sheet 111 in which the piezoelectric elements 112A and 112B are not disposed. Then, as discussed above, since the vibration sheet 111 and the reinforcing sheet 117 are made of the same material, the coefficient of linear expansion and the modulus of elasticity of the reinforcing sheet 117 are the same as those of the vibration sheet 111. It is thus possible to further increase residual compressive stress applied to the piezoelectric elements 112A and 112B.

In the piezoelectric fan 201 of this embodiment, the thickness is partially increased by the provision of the reinforcing sheet 117. Accordingly, it is possible to increase the stiffness ratio of a region defined by the width of the vibration sheet 111 and the distance in the longitudinal direction of the vibration sheet 111 extending from ends of the piezoelectric elements 112A and 112B adjacent to the free end of the vibration sheet 111 to the fixed end of the vibration sheet 111 to a region defined by the width of the vibration sheet 111 and the distance in the longitudinal direction of the vibration sheet 111 extending from the free end of the vibration sheet 111 to the ends of the piezoelectric elements 112A and 112B adjacent to the free end of the vibration sheet 111. Thus, tensile stress applied to the piezoelectric elements 112A and 112B caused by bending vibration of the vibration sheet 111 can be reduced.

That is, in the piezoelectric fan 201 of this embodiment, an increase in the residual compressive stress applied to the piezoelectric elements 112A and 112B and a decrease in the tensile stress applied to the piezoelectric elements 112A and 112B can be implemented at the same time.

Among end portions of the reinforcing sheet 117 and the piezoelectric element 112A extending parallel with the widthwise direction of the vibration sheet 111, end portions of the reinforcing sheet 117 and the piezoelectric element 112A adjacent to the free end of the vibration sheet 111 are bonded to each other such that the end faces are flush with each other.

With this configuration, in the piezoelectric fan 201 of this embodiment, as well as in the piezoelectric fan 101, it is possible to further reduce tensile stress applied to the piezoelectric elements 112A and 112B caused by bending vibration of the vibration sheet 111.

Thus, in the piezoelectric fan 201 of this embodiment, advantages similar to those obtained by the piezoelectric fan 101 of the first embodiment can be achieved.

Figure 5B:
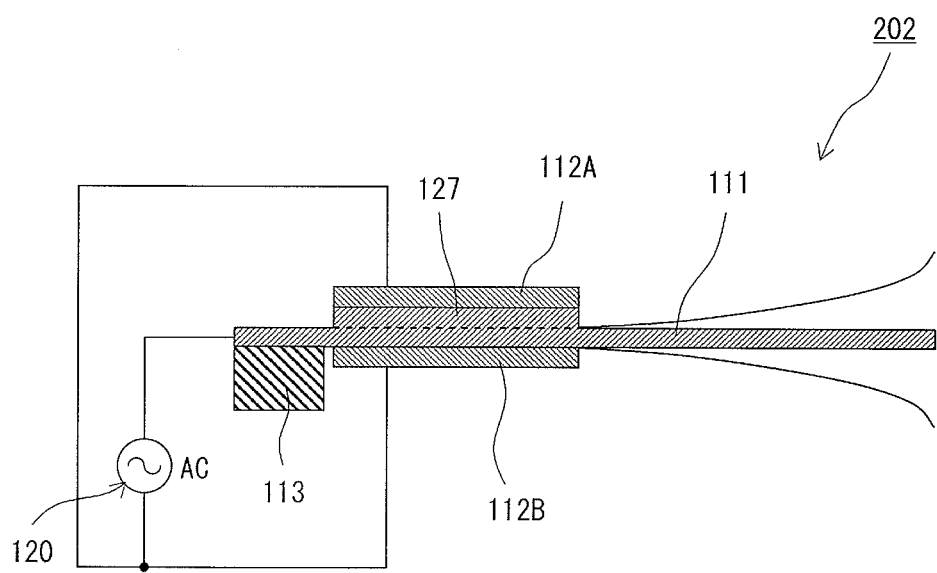
FIG. 5B is a sectional view illustrating the configuration of a piezoelectric fan 202 according to a modified example of the second embodiment.

In FIG. 5A, the reinforcing sheet 117, which corresponds to a "reinforcing member" of the present invention, and the vibration sheet 111 are formed as separate components. When carrying out this embodiment, however, a reinforcing member 127 and the vibration sheet 111 may be integrally formed of the same material, as shown in FIG. 5B.

In this embodiment, the end portion of the reinforcing sheet 117 and the end portion of the piezoelectric element 112A adjacent to the free end of the vibration sheet 111 are bonded to each other such that the end faces are flush with each other. However, this configuration is only an example. For example, the reinforcing sheet 117 and the piezoelectric element 112A may be bonded to each other such that the end portion of the reinforcing sheet 117 adjacent to the free end of the vibration sheet 111 protrudes farther toward the free end of the vibration sheet 111 than the end portion of the piezoelectric element 112A adjacent to the free end of the vibration sheet 111.

Other Embodiments

In the above-described embodiments, the piezoelectric elements 112A and 112B are made of PZT ceramics. However, the material for the piezoelectric elements 112A and 112B is not restricted to PZT ceramics. The piezoelectric elements 112A and 112B may be made of a piezoelectric material of lead-free piezoelectric ceramics, such as potassium sodium niobate or alkali niobate ceramics.

In the above-described embodiments, the reinforcing sheet 117 is made of the same material (stainless steel) as that for the vibration sheet 111. However, the material for the reinforcing sheet 117 is not restricted to this material. The reinforcing sheet 117 may be made of a material different from that for the vibration sheet 111 as long as this material has the same coefficient of linear expansion and the same modulus of elasticity as those of the vibration sheet 111.

In this case, the same coefficient of linear expansion includes a case in which the coefficient of linear expansion of the reinforcing sheet 117 is substantially equal to that of the vibration sheet 111. For example, if the difference between the coefficient of linear expansion of the reinforcing sheet 117 and that of the vibration sheet 111 is within ±1 ppm/K, it is assumed that the coefficient of linear expansion of the reinforcing sheet 117 and that of the vibration sheet 111 are the same.

The same modulus of elasticity includes a case in which the modulus of elasticity of the reinforcing sheet 117 is substantially equal to that of the vibration sheet 111. For example, if the difference between the modulus of elasticity of the reinforcing sheet 117 and that of the vibration sheet 111 is within ±10% of the modulus of elasticity of the vibration sheet 111, it is assumed that the modulus of elasticity of the reinforcing sheet 117 and that of the vibration sheet 111 are the same.

In the above-described embodiments, the size of each of the piezoelectric elements 112A and 112B and that of the reinforcing sheet 117 are substantially equal to each other. However, this configuration is only an example. For example, the size of the reinforcing sheet 117 may be greater than that of each of the piezoelectric elements 112A and 112B.

In the above-described embodiments, the vibration sheet 111 is not curved. However, this configuration is only an example. For example, the vibration sheet 111 may be formed such that it is curved between the piezoelectric elements 112A and 112B and the free end of the vibration sheet 111.

The foregoing description of the embodiments has been provided only for the purposes of illustration and description. It is not intended to be exhaustive or to limit the invention to the precise forms disclosed. It is intended that the scope of the invention be defined, not by the above-described embodiments, but by the following claims. The scope of the present invention is to be accorded the broadest interpretation so as to encompass all such modifications and equivalent structures and functions.

REFERENCE SIGNS LIST 1 vibration sheet
2 piezoelectric element
3 support member
4 electrode
5 bonding layer
8 piezoelectric ceramics
9 piezoelectric fan
10 piezoelectric fan
20 drive circuit
101, 102, 201, 202 piezoelectric fan
111 vibration sheet
112A, 112B piezoelectric element
113 fixing sheet
117 reinforcing sheet
120 drive AC power source
127 reinforcing sheet

The invention claimed is:

1. A piezoelectric actuator comprising:
a vibration sheet having a first principal surface and a second principal surface opposite the first principal surface;
a reinforcing member bonded to the first principal surface of the vibration sheet;
a first piezoelectric element that extends and contracts when an alternating current voltage is applied to the piezoelectric actuator and that is bonded to the reinforcing member opposite the vibration sheet;
a second piezoelectric element that extends and contracts in a phase opposite to the first piezoelectric element when the alternating current voltage is applied to the piezoelectric actuator and that is bonded to the second principal surface of the vibration sheet; and a fixing member directly fixed to and abutting to one end of the vibration sheet, wherein the first piezoelectric element and the second piezoelectric element each comprise a piezoelectric ceramic with electrode films on opposed surfaces thereof.

2. The piezoelectric actuator according to claim 1, wherein the vibration sheet is configured to bend in accordance with the extending and contracting of the first and second piezoelectric elements.

3. The piezoelectric actuator according to claim 1, wherein a total thickness of the reinforcing member and a region of the vibration sheet adjacent to the first and second piezoelectric elements is greater than an average thickness of a region of the vibration sheet not bonded to the first and second piezoelectric elements or the reinforcing member.

4. The piezoelectric actuator according to claim 1, wherein the vibration sheet has a coefficient of linear expansion that is higher than a coefficient of linear expansion of the first and second piezoelectric elements.

5. The piezoelectric actuator according to claim 4, wherein the reinforcing member has a coefficient of linear expansion and a modulus of elasticity that are identical to the coefficient of linear expansion and a modulus of elasticity, respectively, of the vibration sheet.

6. The piezoelectric actuator according to claim 1, wherein the reinforcing member and the first piezoelectric element extend parallel in a widthwise direction of the vibration sheet.

7. The piezoelectric actuator according to claim 6, wherein the reinforcing member extends a distance towards a free end of the vibration sheet farther than the first piezoelectric element.

8. The piezoelectric actuator according to claim 6, wherein respective end portions of the reinforcing member and the first piezoelectric element opposite to the fixing member are flush with each other.

9. The piezoelectric actuator according to claim 8, wherein a space is provided between the fixing member and respective end portions of the reinforcing member and the first piezoelectric element adjacent to the fixing member.

10. The piezoelectric actuator according to claim 1, wherein a space is provided between the fixing member and respective end portions of the reinforcing member and the first piezoelectric element adjacent to the fixing member.

11. The piezoelectric actuator according to claim 1, wherein the first piezoelectric element comprises a thickness identical to a thickness of the second piezoelectric element.

12. The piezoelectric actuator according to claim 11, wherein the first piezoelectric element has a coefficient of linear expansion and a modulus of elasticity that are identical to a coefficient of linear expansion and a modulus of elasticity, respectively, of the second piezoelectric element.

13. The piezoelectric actuator according to claim 1, wherein the reinforcing member comprises a material that is identical to a material for the vibration sheet.

14. The piezoelectric actuator according to claim 13, wherein the reinforcing member and the vibration sheet are integral.

15. The piezoelectric actuator according to claim 1, wherein the first and second piezoelectric elements and the reinforcing member are each disposed in a symmetrical arrangement with respect to a center line of the vibration sheet in the lateral direction.

16. The piezoelectric actuator according to claim 1, wherein the vibration sheet and the reinforcing member both comprise a metallic material.

17. The piezoelectric actuator according to claim 1, wherein the fixing member is bonded to the first principal surface of the vibration sheet.

18. The piezoelectric actuator according to claim 1, wherein the fixing member is bonded to the second principal surface of the vibration sheet.

19. The piezoelectric actuator according to claim 1, wherein the vibration sheet is 15 mm-wide×40 mm-long× 0.1 mm-thick.

20. The piezoelectric actuator according to claim 1, wherein the fixing member is fixed to the one end of the vibration sheet in a cantilever structure.

21. A piezoelectric actuator comprising:

a vibration sheet having a first principal surface and a second principal surface opposite the first principal surface;

a reinforcing member bonded to the first principal surface of the vibration sheet;

a first piezoelectric element that extends and contracts when an alternating current voltage is applied to the piezoelectric actuator and that is bonded to the reinforcing member opposite the vibration sheet;

a second piezoelectric element that extends and contracts in a phase opposite to the first piezoelectric element when the alternating current voltage is applied to the piezoelectric actuator and that is bonded to the second principal surface of the vibration sheet; and a fixing member fixed to one end of the vibration sheet, wherein the first piezoelectric element and the second piezoelectric element each comprise a piezoelectric ceramic with electrode films on opposed surfaces thereof, and wherein the fixing member is spaced from each of the first piezoelectric element and the second piezoelectric element.

* * * * *